United States Patent [19]
Chittipeddi et al.

[11] Patent Number: 5,972,179
[45] Date of Patent: Oct. 26, 1999

[54] SILICON IC CONTACTS USING COMPOSITE TIN BARRIER LAYER

[75] Inventors: Sailesh Chittipeddi, Allentown, Pa.; Sailesh Mansinh Merchant, Orlando, Fla.

[73] Assignee: Lucent Technologies Inc., Murray Hill, N.J.

[21] Appl. No.: 08/941,556

[22] Filed: Sep. 30, 1997

[51] Int. Cl.[6] ................................. C23C 14/14
[52] U.S. Cl. ............... 204/192.17; 427/252; 427/576; 427/535; 438/680; 438/653; 438/627; 438/648; 204/192.15
[58] Field of Search ...................... 438/627, 648, 438/643, 653, 656, 679, 680; 204/192.25, 192.15, 192.17; 427/535, 539, 576, 255.1, 255.2, 255.3, 252

[56] References Cited

U.S. PATENT DOCUMENTS

| 5,232,871 | 8/1993 | Ho ............................................ 438/653 |
| 5,378,660 | 1/1995 | Ngan et al. ........................ 204/192.25 |
| 5,420,072 | 5/1995 | Fiordalice et al. ...................... 438/656 |
| 5,712,193 | 1/1998 | Hower et al. ............................ 438/643 |
| 5,776,831 | 7/1998 | Padmanabhan et al. ............... 438/656 |
| 5,780,356 | 7/1998 | Kim ........................................ 438/627 |

*Primary Examiner*—Nam Nguyen
*Assistant Examiner*—Brinda Raghuveer

[57] ABSTRACT

The specification describes a composite TiN barrier layer structure formed by depositing a first TiN layer by CVD to obtain good step coverage, followed by a second TiN layer formed by PVD to obtain uniform surface morphology for subsequent deposition of an aluminum alloy contact layer. Alternatively, uniform TiN layer morphology is obtained by depositing multiple CVD TiN layers as a series of thin strata, and passivating after each deposition step to fully crystallize each stratum thereby obtaining a uniformly crystallized barrier layer.

11 Claims, 3 Drawing Sheets

SILICON IC CONTACTS USING COMPOSITE TIN BARRIER LAYER

FIELD OF THE INVENTION

This invention relates to methods for forming electrical contacts to silicon substrates or between metallization levels. More specifically it relates to Ti/TiN barrier layers for aluminum alloy contact plugs.

BACKGROUND OF THE INVENTION

A wide variety of metallization approaches for silicon integrated circuits have been used in the past but in current commercial practice a relatively few highly developed and proven systems are considered standard. Nearly all metallization systems use aluminum and aluminum alloys as the predominant interconnect material, but it has been known for some time that aluminum does not form a reliable contact to silicon for substrate connections, or to polysilicon at the gate level interconnect.

An approach to overcome this that has gained wide acceptance is to interpose a barrier layer between the aluminum alloy and the silicon or polysilicon surface. The barrier layer is typically Ti/TiN formed using a cluster tool by sputtering titanium from a titanium target in argon, then introducing nitrogen into the sputtering chamber to produce an overcoating of TiN. Alternatively, the TiN is deposited in a separate chamber of the cluster tool. The titanium layer forms a stable interface and promotes adhesion with silicon, and the TiN layer acts as a barrier between the silicon and the aluminum alloy plug. However, with ever diminishing lithographic design rules the aspect ratio of the windows and the vias shrinks to the point where bottom and sidewall coverage of the Ti/TiN barrier is inadequate. This creates several potential problems. One of the most serious of these is the formation of aluminum spiking in regions where the layers are incomplete or too thin.

To address bottom coverage attempts have been made with collimation techniques for the sputtered beam to fill the bottom of the window or via. While this improves bottom coverage, sidewall coverage is still a problem due to the anisotropic nature of the deposition.

Another approach to non-uniform barrier layer coverage has been to deposit the TiN barrier layer using CVD. See e.g., Sherman, "Titanium Nitride Deposition in a Cold Wall CVD Reactor", Materials Research Society—Proceedings of the 1988 Workshop, pp. 323–329 (1989); Pintchovski et al "LPCVD Titaniun Nitride—Deposition, Properties, and Applications To ULSI", Materials Research Society—Proceedings of the 1988 Workshop, pp. 275–282 (1989); This deposition technique produces conformal coatings, improving both the step coverage (sidewall) and the bottom coverage. Since the quality and coverage of CVD deposited films is superior to sputtered films the thickness of the TiN barrier layer can be substantially reduced, from typically a thousand angstroms for sputtered barriers to 20–400 angstroms for CVD barrier layers.

TiN is typically deposited by CVD using two precursor materials, $TiCl_4$ or an organic titanium compound, e.g. tetrakis—(dimethylamino) titanium (TDMAT) or tetrakis—(diethylamino) titanium TDEAT. For further details of this process see e.g. Konecni et al, "A Stable Plasma Treated CVD Titanium Nitride Film For Barrier/Glue Layer Applications", 1996 VMIC Conference 1996 ISMIC—106/96/0181(c), pp. 181–183, 1996.

CVD TiN deposited using $TiCl_4$ has a very high resistivity unless it is deposited at elevated temperatures, typically 500–550° C. Therefore its application may be limited to contact (window) plugs. Moreover, TiN produced using $TiCl_4$ has a high Cl impurity content. Chlorine is corrosive and at high levels is unacceptable in IC environments. The organic precursors, e.g. TDMAT, are gaining popularity in the field because of the highly conformal nature of the coating, low deposition temperature, and simple processing techniques. However, we have discovered that this technique has several limitations.

CVD-TiN deposited for barrier layers requires a post deposition treatment in $N_2$ to stabilize the layer (see Konecni et al ref. above). Usually, the treatment is carried out using a plasma in the same chamber. The organic precursors TDMAT and TDEAT leave residual carbon and oxygen. The stabilization treatment assists in removing carbon and replaces the amine groups in the TiN film. However, the film typically undergoes crystallization, with substantial shrinkage e.g. 50%, particularly in the field areas and at the bottom of the window/via where plasma exposure is highest. The sidewalls receive less exposure to the plasma and therefore retain most of the original thickness. In fact, sidewalls show greater than 100% (approx. 110–130%) of the field TiN thickness after plasma treatment. This difference in exposure results in a difference in the morphology of the film between the sidewalls and the bottom. The sidewalls show some crystallization but remain mostly amorphous. The bottom regions, however, have a highly crystalline or nano-crystalline morphology. The sidewall shows a thin layer of crystalline material on an amorphous underlayer while the field and bottom regions show crystalline or nano-crystalline features. Since the degree of transformation varies in a plasma-treated film, depending upon the location in a feature such as a window or via, the crystallographic texture of the treated TiN film will also vary. When Al is deposited on the plasma treated TiN films, because of the varying texture, the Al texture will also vary. Consequently, for illustration, the Al will have a <111> texture at the bottom and the field regions, and non-<111> texture on the sidewalls. The amount of Al <111> texture will also depend on the degree of TiN transformation, plasma treatment parameters, processing parameters, etc.

Since the Al is of varying texture along various regions of the opening, the reliability of the Al plug and film will be suspect, since Al films with <111> texture are reported to have good resistance to electromigration and stress-induced voiding. Therefore, films of varying texture will have questionable reliability.

Moreover, since the plasma exposure at different locations of the opening (contact or via) varies, the grain size of the plasma-treated TiN (hereafter called transformation region) will also vary. The non-uniform variation in grain size, attendant with very small grains and therefore a large number of available diffusion paths per unit area, will allow localized migration of Al and an increased propensity for junction leakage and spiking.

STATEMENT OF THE INVENTION

We have developed a barrier layer process that produces excellent step and bottom coverage, and produces a substantially homogeneous morphology in the barrier layer. As a result the aluminum alloy window plug also deposits with a uniform morphology thereby providing substantially improved interface characteristics and contact performance. Uniformity of the barrier layer morphology is obtained by capping the CVD layer with a PVD layer. Material deposited by PVD is found to exhibit significantly higher ordering and uniformity than plasma-treated CVD material. By using a combination of these deposition techniques, with the last deposit made by PVD, the attributes of both deposition techniques are obtained, i.e. excellent step and bottom coverage characteristic of the CVD technique, and uniform morphology characteristic of the PVD deposition technique.

An alternative technique for producing uniform morphology in the TiN barrier layer is to deposit the layer in three or more strata, with a plasma treatment of each stratum in between depositions. Due to the small thickness of the strata, most of the material is reordered during the passivation process. This produces a more uniform crystal structure in each layer than is obtained when the layer is deposited and the deposited material attempts to reorder in a single operation.

DETAILED DESCRIPTION

Figure 1:
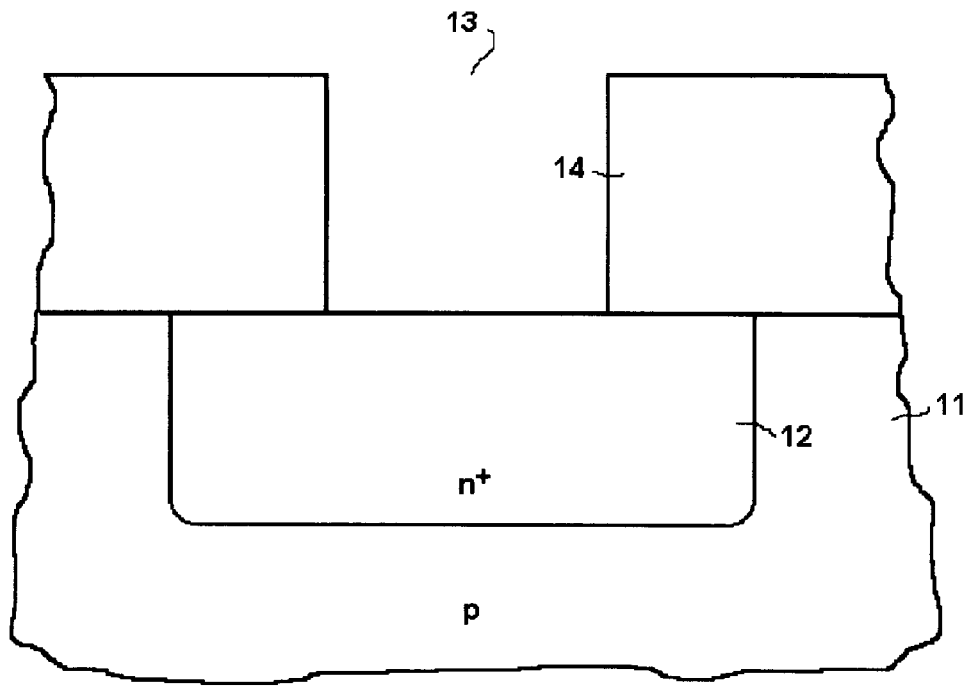
FIGS. 1–5 are schematic representations of process steps for forming an aluinum alloy contact in the contact window of a silicon device.

Referring to FIG. 1, a silicon substrate 11 is shown with an impurity region 12. The substrate illustrated is p-type, and the impurity region 12 is n-type, typical of a source or drain for an n-channel silicon transistor. The figures show only a portion of the silicon device for illustration. The contact window is shown at 13, and typically is formed during etchback of oxide 14. Although a contact window to a silicon substrate is used in these process sequences to illustrate the invention, the problem outlined above arises also for interlevel contacts between the polysilicon level and the first aluminum level. As indicated earlier the invention is directed to both situations, as well as other applications in which barrier layer technology may be used.

Figure 2:
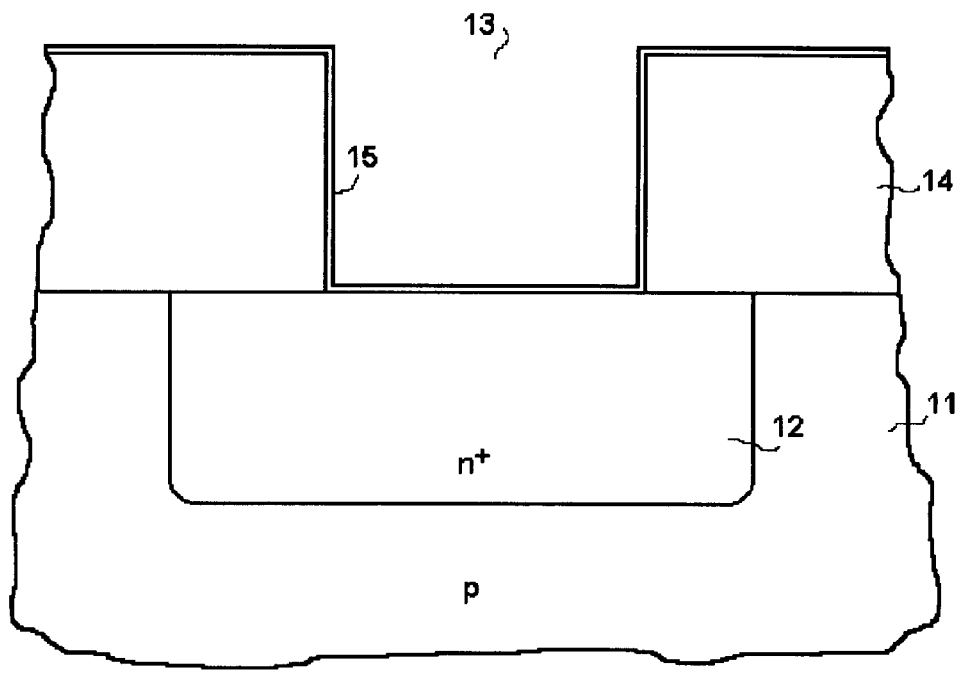

With reference to FIG. 2, formation of the barrier layer begins with the deposition of a layer 15 of Ti. The Ti layer is deposited using known techniques. In the preferred embodiment, the Ti layer is deposited using sputtering methods (PVD). For example, a collimated Ti film effective for the purposes of the invention can be deposited using a Varian M2i reactor, and sputtering a titanium target in pure argon at a temperature (pedestal) of 100–400° C., preferably, approximately 250° C., a pressure in the range 2–6 mTorr, and a power level in the range 3–10 kW, preferably approximately 6 kW. The thickness of layer 15 is in the range 30–400 Angstroms, preferably approximately 50–150 Angstroms.

Figure 3:
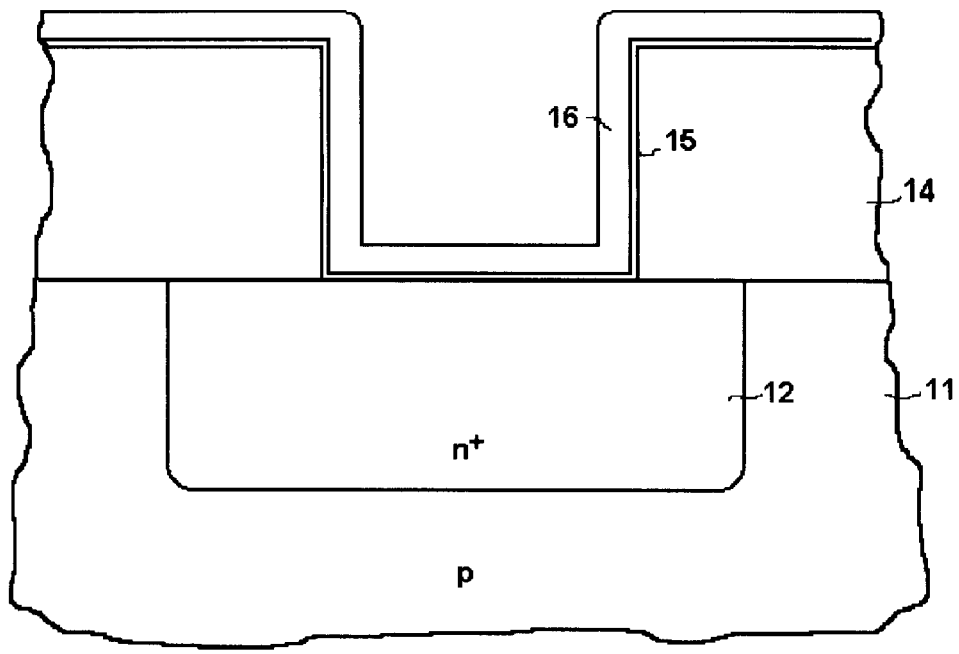
Figure 4:
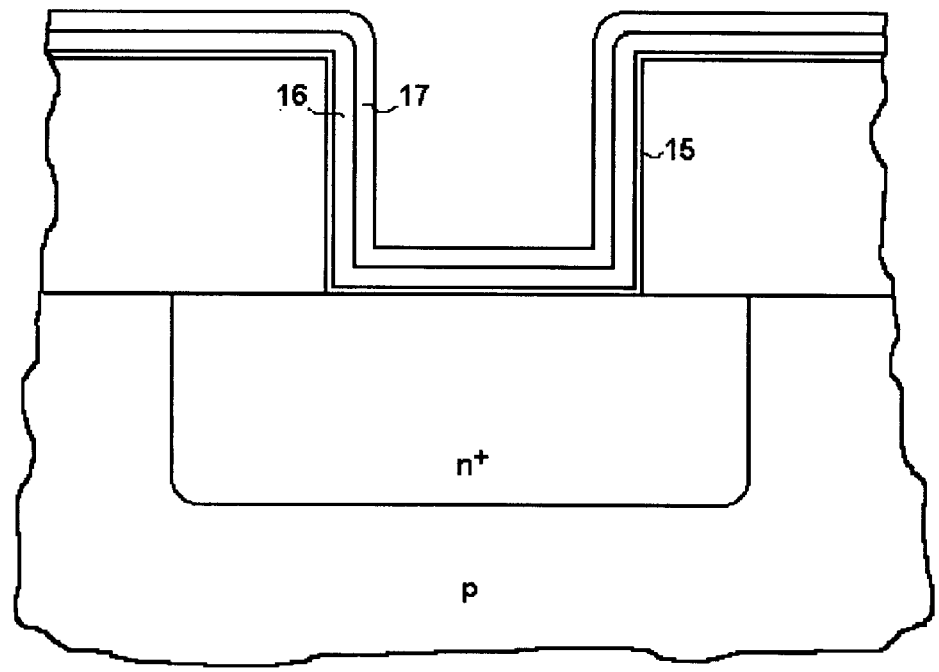

In the same apparatus, and preferably without removing the wafers from the deposition apparatus, a TiN layer 16 is deposited on layer 15 as shown in FIG. 3. For illustrative purposes in these figures the TiN layer is shown substantially thicker than the titanium layer. It should be understood that the drawings are intended to be accurate qualitative representations of actual structures but are not drawn to scale. The TiN layer is deposited by CVD using precursors such as TDMAT or TDEAT according to known techniques. For example, a CVD TiN layer suitable for the purposes of the invention can be produced in a CVD reactor at a temperature in the range 400–460° C. (pedestal), using TDMAT at a flow rate of 225 sccm in a carrier gas of He at 275 sccm. Deposition is continued for a period sufficient to produce a TiN layer with a thickness comparable to, but preferably somewhat thicker than, the Ti underlayer, i.e. 50–600 Angstroms, and preferably 100–200 Angstroms. In a preferred embodiment of the invention, the CVD TiN layer is immediately followed by a layer of TiN deposited by sputtering (PVD-TiN) layer 17 as shown in FIG. 4. The PVD-TiN is deposited by sputtering from a Ti target in a mixture of argon/nitrogen with a ratio in the range 2:1 to 5:1. The deposition temperature is in the range 100–400° C., preferably 225–275° C., the pressure is in the range 2–6 mTorr, and the power level is in the range 18–24 kW, preferably approximately 20 kW. The PVD film may be deposited using collimated or ion assisted deposition techniques as is known in the art. The thickness of the PVD-TiN film will depend on the aspect ratio and dimensions of window 13 and the amount of coverage necessary to blanket the previously deposited CVD-TiN layer 16. Typically, the thickness of layer 17 will be in the range 100–400 Angstroms, and preferably 200–300 Angstroms. In this embodiment of the invention, layer 17 is deposited at relatively low temperatures, preferably below 400° C. In the preferred processing sequence, all depositions (i.e. layers 15–17) are carried out in the same apparatus, e.g. a cluster tool where layers 15–17 are deposited sequentially. Those skilled in the art may develop variations of the proposed invention. For example, layers 15 and 16 may be deposited in one tool and layer 17 in another, etc.

In an alternative embodiment of the invention, the CVD-TiN layer 16 is treated by a plasma to at least partially reorient the crystal structure of the film prior to deposition of the PVD-TiN film. A suitable plasma treatment is 30 sec. at 1.3 mTorr, and 400–460° C., in an atmosphere of nitrogen and hydrogen.

Figure 5:
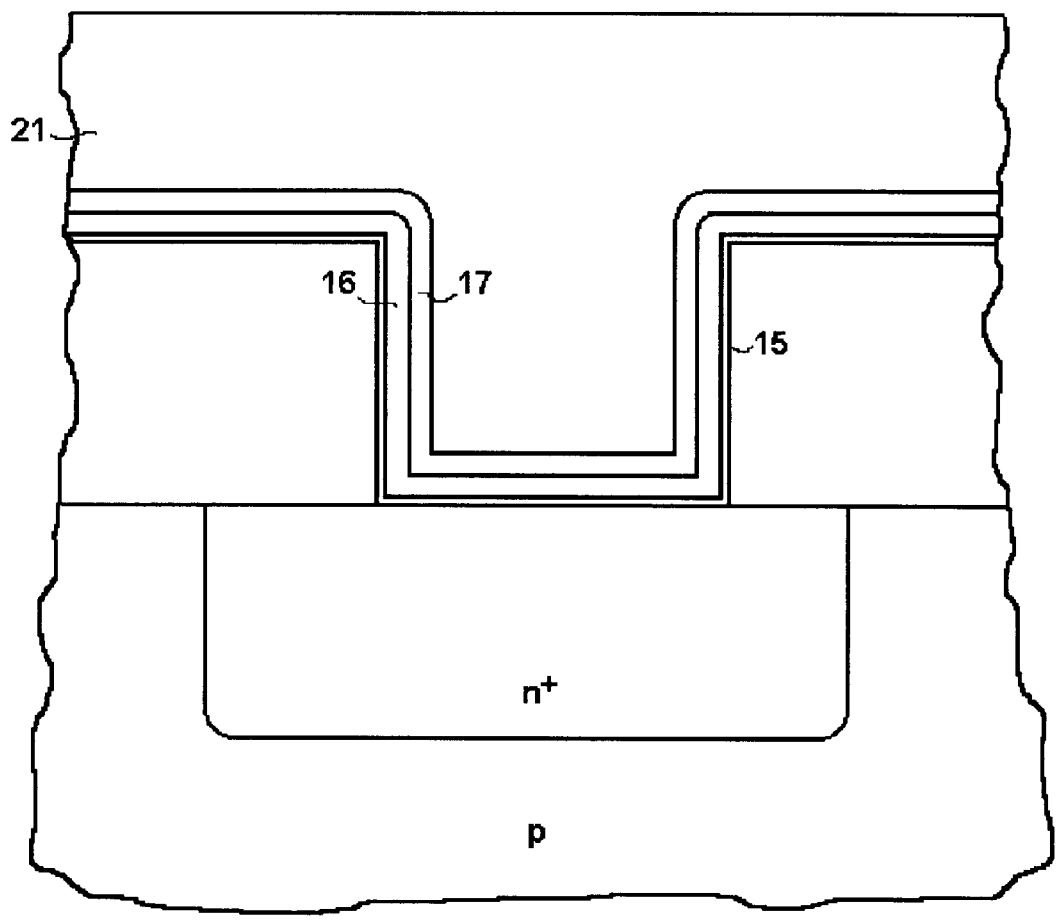

Next the Al-alloy contact layer 21 is deposited in the window as shown in FIG. 5. The contact layer is 4000–15000 Angstroms thick, so as to essentially plug the opening 13 (shown as a window but as indicated earlier may be a via), as well as provide runners and interconnects as required. The Al layer is typically Al-Si with 0.5 to 2.0 wt % Si. Other alloys may be used such as Al with 0.5–2.0 wt % Cu, or ternary alloys of Al-Si-Cu. Ge or Sc may also be added for improved reliability. In a preferred embodiment, the Al metallization is sputtered from an alloy target using known techniques. Alternatively, a CVD Al deposition technique can be used, or one or more CVD Al layers can be alternated with one or more PVD Al layers with alloying elements for improved reliability. It is convenient, and effective from a cost standpoint, to deposit the Al layer 21 in the same apparatus used to deposit layers 15–17.

Improved contact resistance can be obtained in many cases by annealing the Ti-TiN layers prior to deposition of aluminum to form a silicide between the Ti layer and the silicon substrate or first level metal.

As discussed above, the morphology of the Al-alloy film tends to replicate that of the surface on which it deposits. Consequently, the Al-alloy layer 21 will replicate the texture of layer 16. Since the microstrcture and texture of the CVD-TiN layer without the PVD-TiN over-layer is highly irregular from region to region in the opening 13, the Al microstructure and texture on CVD-TiN alone will also be irregular. If, however, the Al-alloy layer 21 is deposited on the CVD-TiN/PVD-TiN stack, then the Al-alloy texture will preferentially adjust to a <111> texture. In such a Ti/CVD-TiN/PVD-TiN composite structure, good step coverage is ensured by the CVD-TiN layer 16, and uniform crystal structure and texture is ensured by the PVD-TiN layer 17.

The effectiveness of barrier layers produced by the process just described can be further enhanced by forming an additional barrier layer between the composite CVD/PVD structure. This layer comprises titanium oxynitride. The layer thickness should be in the range 50–200 Angstroms. The oxynitride layer can be produced easily by bleeding oxygen into the reaction chamber during plasma passivation of the CVD TiN layer.

The terms chemical vapor deposition (CVD) and physical vapor deposition (PVD) have well established meaning in the art. PVD processes include sputtering, including reactive sputtering, and evaporation. These physical processes when used with the materials described here and in the context of the invention produce characteristically crystalline or nanocrystalline deposits. In CVD processes on the other hand, the material deposits by chemical reaction at the surface being coated, and at a comparatively low temperature. Thus the deposit proceeds on an atomic level and relatively little crystal orientation occurs.

As mentioned above the invention may be applied to window plugs or interlevel plugs in silicon integrated circuits. The term silicon as used herein and in the appended claims is intended to cover single crystal silicon (substrate) or polysilicon (metallization).

Various additional modifications of this invention will occur to those skilled in the art. All deviations from the specific teachings of this specification that basically rely on the principles and their equivalents through which the art has been advanced are properly considered within the scope of the invention as described and claimed.

We claim:

1. Process for the manufacture of silicon integrated circuits wherein at least one aluminum alloy contact is made to a silicon surface, the process comprising the steps of:

a. depositing a layer of titanium on said silicon surface, b. depositing a first layer of TiN by chemical vapor deposition on the layer of titanium, c. depositing a second layer of TiN on first layer of TiN said second layer of TiN deposited by sputtering, and d. depositing a layer comprising aluminum on said second layer of TiN.

2. The process of claim 1 in which the thickness of layers b and c is in the range 80–1000 Angstroms.

3. The process of claim 2 wherein the first layer of TiN has a thickness in the range 30–400 Angstroms.

4. The process of claim 3 wherein the second layer of TiN has a thickness in the range 50–600 Angstroms.

5. The process of claim 1 in which the aluminum alloy is Al with 0.5–2 wt % Si.

6. The process of claim 1 in which the first layer of TiN is formed using a precursor selected from the group consisting of TDMAT and TDEAT.

7. The process of claim 1 including the additional step of treating said first layer of TiN in a nitrogen plasma prior to the deposition of the second layer of TiN.

8. The process of claim 1 including the additional step of exposing the first layer of TiN to a plasma comprising oxygen to form a layer of titanium oxynitride.

9. The process of claim 1 in which steps a, b, and c are carried out sequentially in the same apparatus.

10. The process of claim 1 wherein the layer comprising aluminum is deposited by sputtering.

11. The method of claim 1 wherein steps b and c are repeated at least once.

* * * * *